(12) United States Patent
Park et al.

(10) Patent No.: US 12,237,204 B1
(45) Date of Patent: Feb. 25, 2025

(54) CERAMIC SUSCEPTOR AND METHOD OF MANUFACTURING SAME

(71) Applicant: MiCo Ceramics Ltd., Anseong-si (KR)

(72) Inventors: So Young Park, Anseong si (KR); Byung Gil Chun, Anseong si (KR)

(73) Assignee: MiCo Ceramics Ltd., Anseong-si (KR)

( * ) Notice: Subject to any disclaimer, the term of this patent is extended or adjusted under 35 U.S.C. 154(b) by 0 days.

(21) Appl. No.: 18/796,450

(22) Filed: Aug. 7, 2024

(51) Int. Cl.
*H01L 21/687* (2006.01)
*B32B 15/04* (2006.01)
*B32B 15/20* (2006.01)
*H01L 21/683* (2006.01)

(52) U.S. Cl.
CPC ........ *H01L 21/68757* (2013.01); *B32B 15/04* (2013.01); *B32B 15/20* (2013.01); *H01L 21/6833* (2013.01); *B32B 2307/7376* (2023.05)

(58) Field of Classification Search
CPC ............ H01L 21/6833; H01L 21/68757; H01J 37/32715; H01J 37/32724
See application file for complete search history.

(56) References Cited

U.S. PATENT DOCUMENTS

| | | |
|---|---|---|
| 2013/0021717 A1 | 1/2013 | Singh |
| 2016/0181137 A1 | 1/2016 | Lee et al. |
| 2022/0189812 A1 | 1/2022 | Takebayashi et al. |

FOREIGN PATENT DOCUMENTS

| | | | |
|---|---|---|---|
| KR | 10-2012-0078270 A | 7/2012 | |
| KR | 10-2014-0051961 A | 5/2014 | |
| KR | 10-2016-0078220 A | 7/2016 | |
| KR | 10-2372810 B1 | 3/2022 | |
| KR | 10-2022-0083560 A | 6/2022 | |
| KR | 20240131594 A | * 9/2024 | ....... H01L 21/68757 |

* cited by examiner

*Primary Examiner* — Tyrone V Hall, Jr.
(74) *Attorney, Agent, or Firm* — Novick, Kim & Lee, Pllc; Jae Youn Kim

(57) ABSTRACT

The present disclosure relates to a ceramic susceptor. In a method of manufacturing a base body of a ceramic susceptor of the present disclosure, which includes a lower plate and an upper plate, which are each made of a metal-ceramic composite and bonded to each other, the method includes: sequentially laminating a first active metal layer, a first aluminum layer, and a brazing filler layer on a bonding surface of the upper plate; sequentially laminating a second active metal layer and a second aluminum layer on a bonding surface of the lower plate; and brazing-bonding the lower plate and the upper plate with the brazing filler layer.

10 Claims, 5 Drawing Sheets

CERAMIC SUSCEPTOR AND METHOD OF MANUFACTURING SAME

CROSS-REFERENCE TO RELATED APPLICATION(S)

This application is based on and claims priority under 35 U.S.C. 119 to Korean Patent Application No. 10-2023-0110990, filed on Aug. 24, 2023, in the Korean Intellectual Property Office, the disclosure of which is herein incorporated by reference in its entirety.

BACKGROUND OF THE INVENTION

1. Field of the Invention

The present disclosure relates to a ceramic susceptor, and in particular, to brazing-bonding for improving bonding strength between upper and lower plates of a metal matrix composite (MMC) base body.

2. Description of the Prior Art

In general, a semiconductor device or a display device is manufactured by sequentially laminating a plurality of thin film layers including a dielectric layer and a metal layer on a glass substrate, a flexible substrate, or a semiconductor wafer substrate and then patterning the thin film layers. These thin film layers are sequentially deposited on the substrate through a chemical vapor deposition (CVD) process or a physical vapor deposition (PVD) process. The CVD process includes a low-pressure CVD (LPCVD) process, a plasma-enhanced CVD (PECVD) process, a metal organic CVD (MOCVD) process, and the like.

In CVD and PVD apparatuses, a ceramic susceptor is placed to support a glass substrate, a flexible substrate, a semiconductor wafer substrate, or the like and to execute a semiconductor process. The ceramic susceptor may include a chuck electrode installed in the CVD and PVD apparatuses to support a substrate, and a heating wire configured to heat the substrate in a heat treatment process or the like. In addition, the ceramic susceptor may include a radio frequency (RF) electrode (hereinafter, simply referred to as an "RF electrode") instead of the heating wire or may further include an RF electrode to be also used to form plasma in an etching process of the thin film layers formed on the substrate.

FIGS. 1A and 1B are views to be referred to explain problems with a conventional ceramic susceptor. FIG. 1A illustrates the bonding of upper and lower plates by a brazing filler of an Al-based base body, and FIG. 1B illustrates the bonding of upper and lower plates of a metal matrix composite (MMC) (which may be simply referred to as "MMC" below) base body with a brazing filler.

As illustrated in FIG. 1A, the upper and lower plates of the Al-based base body of a conventional ceramic susceptor may be bonded through a general aluminum brazing-bonding method. In this case, since the base body and the brazing filler are made of the same series material, good brazing-bonding may be achieved.

Currently, especially, in order to prevent low-temperature deformation in extreme process environment changes, a metal matrix composite (MMC), which is a composite of Al and ceramic powder, i.e., a metal-ceramic composite, is being applied to the base body of a ceramic susceptor. However, as illustrated in FIG. 1B, in the case of a base body of an MMC base body of a conventional ceramic susceptor, in which the upper and lower plates are bonded to each other by a general aluminum brazing-bonding method, since the brazing filler is a different series from the metal-ceramic composite materials of the upper and lower plates, problems, such as leakage of a process gas such as He gas, leakage of coolant in a cooling channel, and poor vacuum, may occur during a process within semiconductor equipment due to poor bonding, causing defects in the process itself and lower yield.

SUMMARY OF THE INVENTION

Therefore, the present disclosure was made to solve the above-mentioned problems, and the present disclosure provides a method of manufacturing a base body of a ceramic susceptor in which multi-layer (active metal layer and aluminum layer) surface treatment is applied between base body plates and a brazing filler in order to improve the bonding strength of the upper and lower plates of an MMC base body and a ceramic susceptor to which the base body is applied.

First, to summarize the features of the present disclosure, in a method of manufacturing a base body of a ceramic susceptor according to an aspect of the present disclosure, which includes a lower plate and an upper plate which are each made of a metal-ceramic composite and bonded to each other, the method includes: sequentially laminating a first active metal layer, a first aluminum layer, and a brazing filler layer on a bonding surface of the upper plate; sequentially laminating a second active metal layer and a second aluminum layer on a bonding surface of the lower plate; and brazing-bonding the lower plate and the upper plate such that the first aluminum layer and the second aluminum layer are bonded to each other via the brazing filler layer.

The lower plate includes a groove between bonding surfaces of the lower plate.

The first active metal layer and the second active metal layer may include one or more of Ti, Zr, Nb, Hf, and Ta.

The first active metal layer and the second active metal layer may have a thickness of 1 to 5 μm.

The first aluminum layer and the second aluminum layer may have a thickness of 5 to μm.

According to another aspect of the present disclosure, a ceramic susceptor includes a base body and an insulating plate, in which the base body includes a lower plate and an upper plate, each of which is made of a metal ceramic composite, and a bonding portion there between. The bonding portion includes: a first active metal layer, a first aluminum layer, and a brazing filler layer sequentially laminated on the upper plate; and a second active metal layer and a second aluminum layer sequentially laminated on the lower plate, and the lower plate and the upper plate are brazing-bonded by the brazing filler layer.

In the ceramic susceptor according to the present disclosure and its manufacturing method, by applying multi-layer (active metal layer and aluminum layer) surface treatment between each of the upper and lower plates of the base body and the brazing filler, the bonding strength between the upper plate and the lower plate of the MMC base body can be improved. As a result, it is possible to reduce the leak rate of He gas or the like during a process within semiconductor equipment so that the degree of vacuum can be increased, and to reduce leaking of coolant in a cooling channel, thereby contributing to improving yield by maintaining a stable process. In the examples, it was confirmed that the He gas leak rate was lowered from the previous 1.0E-03 (mbar*l/s) to the level of 2.0.E-08 (mbar*l/s) after improvement.

BRIEF DESCRIPTION OF THE DRAWINGS

The accompanying drawings, which are included as a part of a detailed description to help the understanding of the present disclosure, provide embodiments of the present disclosure, and illustrate the technical spirit of the present disclosure together with the detailed description, in which.

DETAILED DESCRIPTION OF THE EXEMPLARY EMBODIMENTS

Figure 1A:
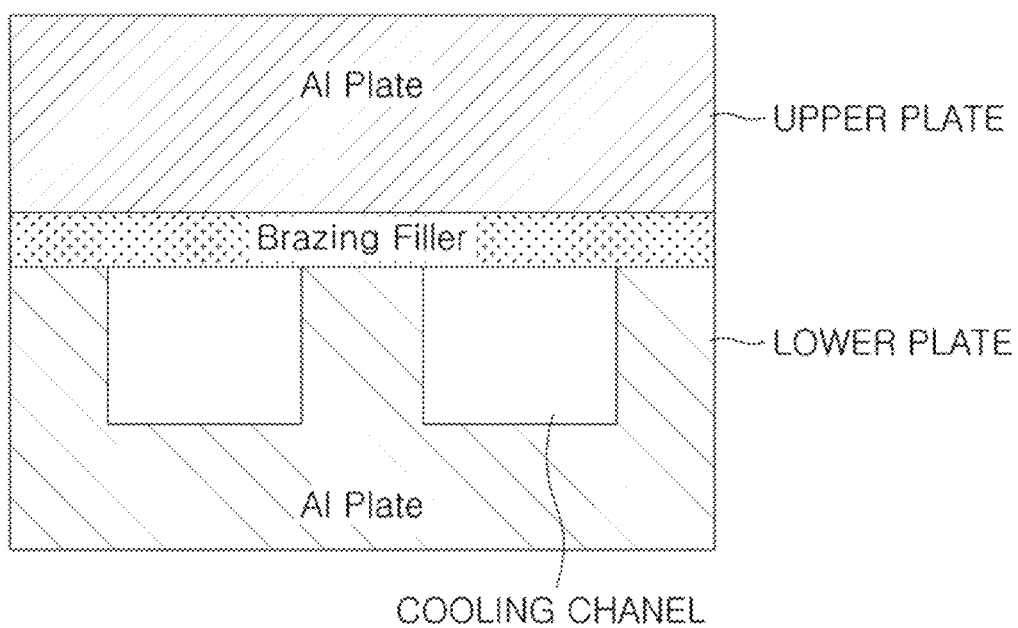
FIGS. 1A and 1B are views to be referred to explain problems with a conventional ceramic susceptor.
Figure 1B:
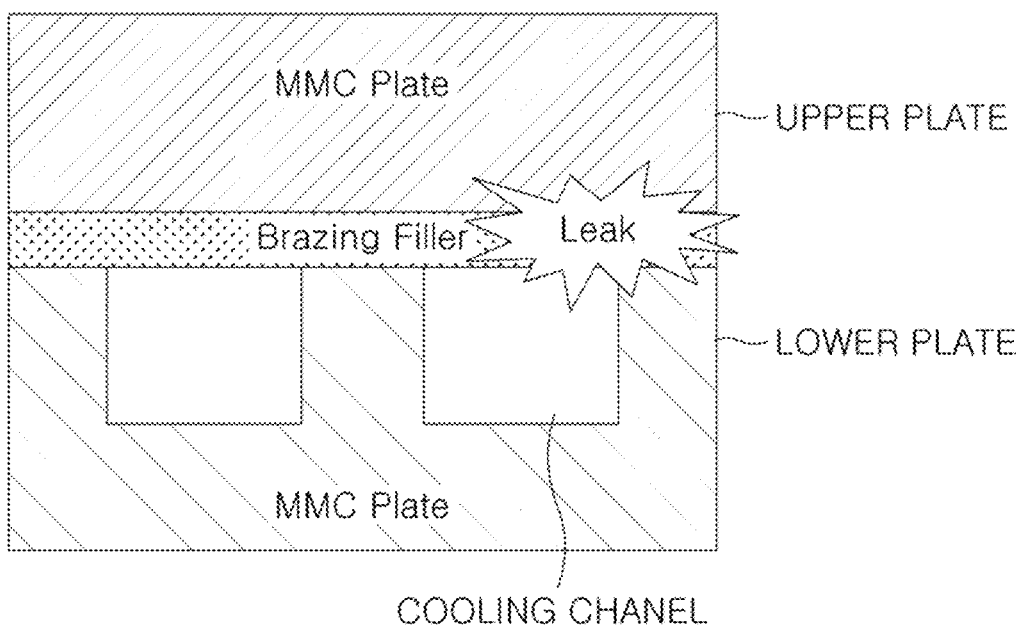

Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not entirely reflect the actual size. Therefore, the descriptions provided herein are not limited by the relative sizes or spacings of the components drawn in each drawing.

In describing the embodiments of the present disclosure, when a detailed description of the known technology related to the present disclosure is determined to unnecessarily obscure the subject matter of the present disclosure, the detailed description will be omitted. In addition, terms to be described later are defined in consideration of functions in the present disclosure, and may vary according to the intention, custom, or the like of a user or operator. Therefore, the definitions of the terms should be made based on the description throughout this specification. Terms used in the detailed description are only for describing the embodiments of the present disclosure, and should not be construed as limiting in any way. Unless expressly used otherwise, singular expressions include the meanings of plural expressions. As used herein, expressions such as "including" or "comprising" are intended to indicate any features, numbers, steps, operations, elements, or some or combinations thereof, and should not be construed to exclude the existence or possibility of one or more other features, numbers, steps, operations, elements, or some or combinations thereof, in addition to those described above.

In addition, terms such as "first" and "second" may be used to describe various components, but the components are not limited by the terms, and these terms are only used for the purpose of distinguishing one component from another.

First, in the present disclosure, the ceramic susceptor is a semiconductor device for processing a substrate to be processed for various purposes such as a semiconductor wafer, a glass substrate, and a flexible substrate. the ceramic susceptor may include an electrostatic chuck electrode to be used as an electrostatic chuck to support a substrate to be processed, or may include a heating wire (or heating element) to heat the substrate to be processed to a predetermined temperature. Alternatively, the ceramic susceptor may include an RF electrode additionally or instead of the heating wire for processing such as plasma enhanced chemical vapor deposition on a substrate to be processed.

Therefore, in the following description, a conductor (or electrode) to be mentioned below will be described by taking the heating wire (or heating element) as an example, but is not limited thereto. It should be noted in advance that the conductor (or electrode) may also be directly applied to the RF electrode or the electrostatic chuck electrode.

For example, the heating wire (or heating element) as the conductor (or electrode) may be provided in the form of a plate-shaped coil or a flat plate using a resistance wire having a predetermined resistance. In addition, the heating wire (or heating element) may be fabricated in a multi-layer structure for precise temperature control. The heating wire (or heating element) may be supplied with power to perform a function of heating a substrate located on the upper surface of the ceramic susceptor to a predetermined temperature to smoothly perform vapor deposition and etching processes in a semiconductor manufacturing process.

In addition, for example, the electrostatic chuck electrode or RF electrode as the conductor (or electrode) is made of a conductive metal material, such as silver (Ag), gold (Au), nickel (Ni), tungsten (W), molybdenum (Mo), titanium (Ti), or an alloy thereof. In a semiconductor manufacturing process, the electrostatic chuck electrode may receive a power bias to generate electrostatic force, thereby executing chucking of a substrate placed on the upper surface of the ceramic susceptor. When unloading the substrate, the electrostatic chuck electrode may receive an opposite bias to be discharged, thereby executing dechucking of the substrate. In the semiconductor manufacturing process, the RF electrode may receive power to enable processing such as plasma-enhanced chemical vapor deposition on the substrate located on the upper surface of the ceramic susceptor.

Figure 3:
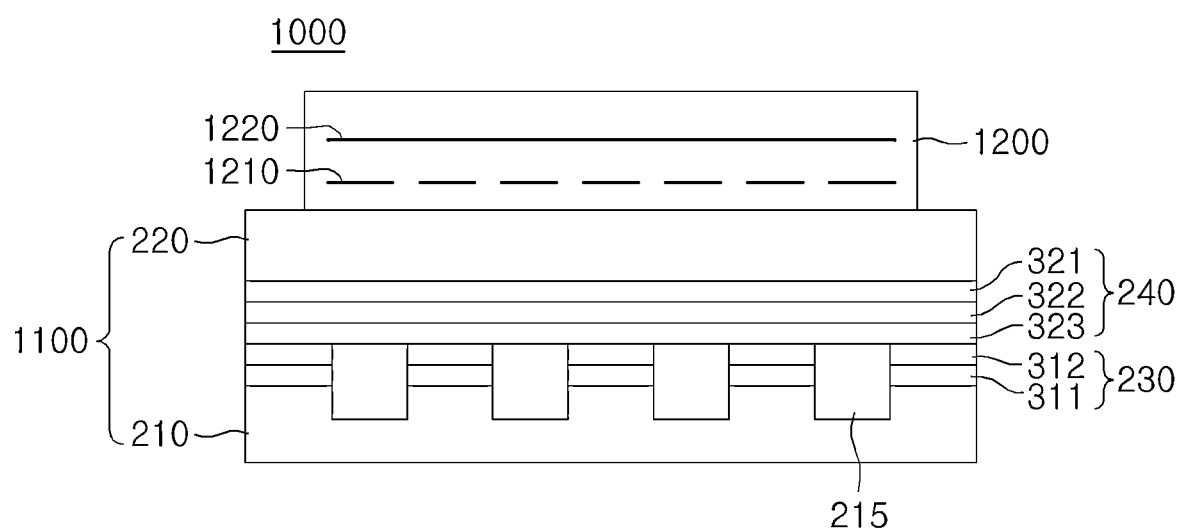
FIG. 3 is a view to be referred to explain a structure of bonding an insulating plate to the base body of the ceramic susceptor according to an embodiment of the present disclosure.
Figure 4:
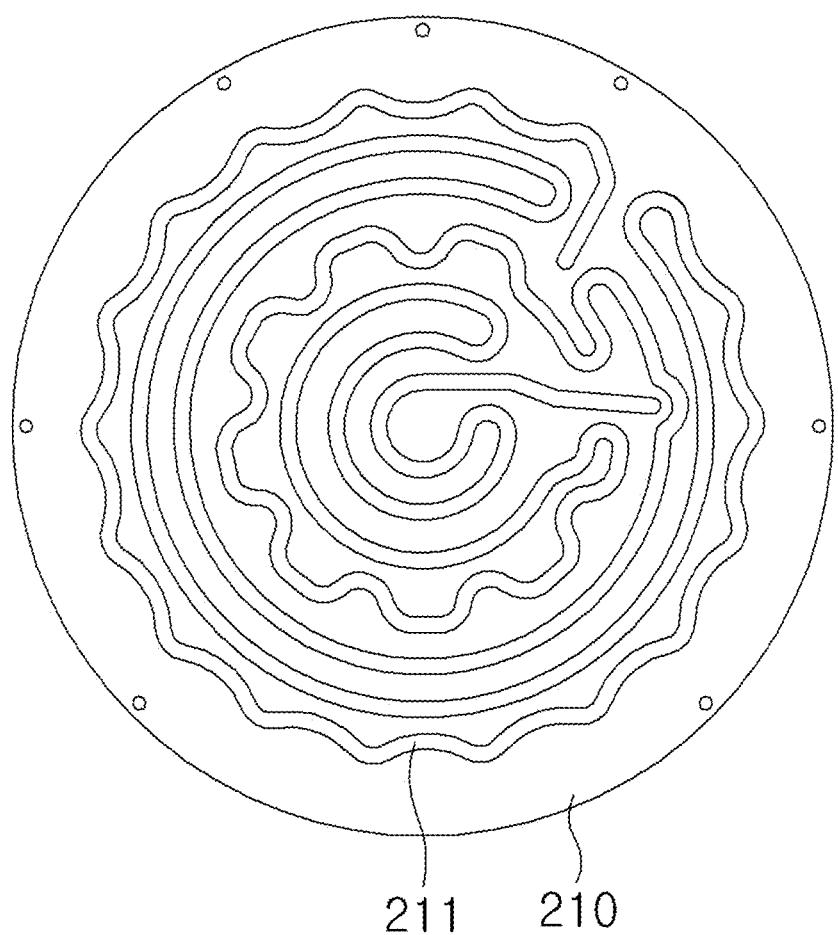
FIG. 4 is a view illustrating an example of a photograph of an actually manufactured lower plate for the base body of the ceramic susceptor according to an embodiment of the present disclosure.

A ceramic susceptor 1000 of the present disclosure includes a base body (1100 in FIG. 3) including a lower plate (210 in FIG. 3) and an upper plate (220 in FIG. 3) bonded to each other, an insulating plate (1200 in FIG. 3) bonded onto the base body, and conductors (or electrodes) 1210 and 1220 described above are disposed/buried in the insulating plate (1200 in FIG. 3).

Hereinafter, with reference to FIGS. 2A to 2C and FIGS. 3 to 5, a method of manufacturing the ceramic susceptor 1000 according to an embodiment of the present disclosure and the structure of the ceramic susceptor 1000 manufactured thereby will be described in detail.

Figure 2A:
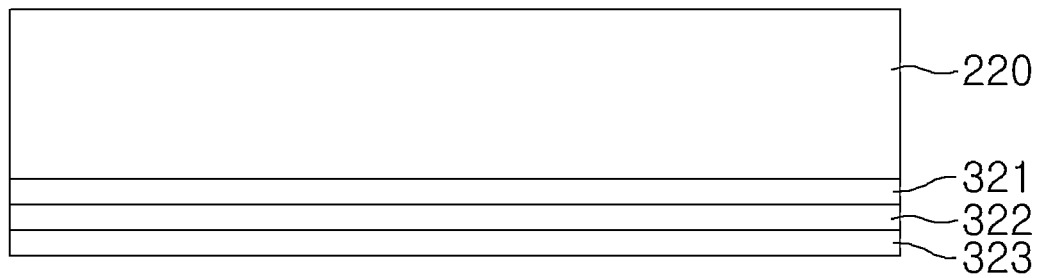
FIGS. 2A. 2B and 2C are cross-sectional views of lower and upper plates of a base body to be referred to explain a method of manufacturing a ceramic susceptor according to an embodiment of the present disclosure.
Figure 2B:
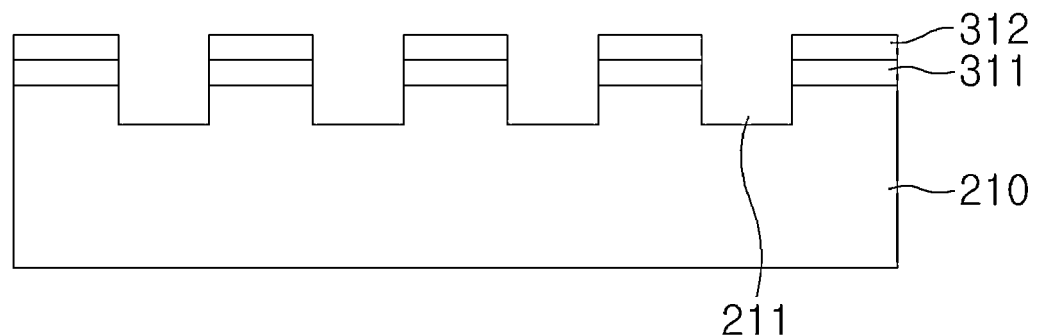
Figure 2C:
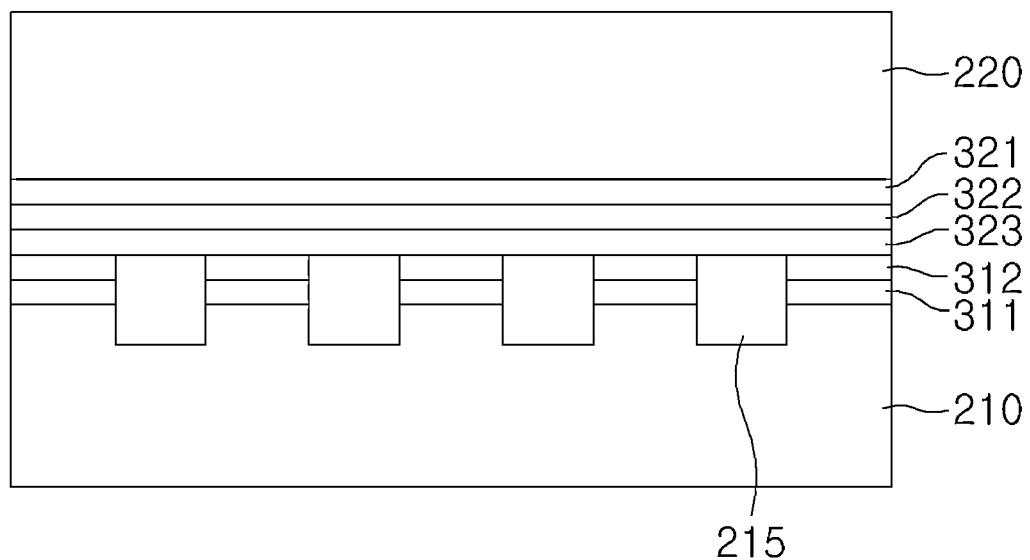

FIGS. 2A to 2C are cross-sectional views of lower and upper plates of a base body for explaining a method of manufacturing a ceramic susceptor according to an embodiment of the present disclosure.

Referring to FIG. 2A, in order to manufacture the ceramic susceptor 1000 according to an embodiment of the present disclosure, first, a first active layer 321, a first aluminum layer 332, and a brazing filler layer 323 are sequentially laminated on the bonding surface of an upper plate 220, i.e., one side surface of the upper plate 220.

In addition, referring to FIG. 2B, a second active metal layer 311 and a second aluminum layer 312 are sequentially laminated on the bonding surface of the lower plate 210, that is, the substrate other than a groove 211 (see FIG. 4), which will form a cooling channel (215 in FIG. 3) of the lower plate 210.

In addition, referring to FIG. 2C, a base body 1100 of the ceramic susceptor 1000 of the present disclosure configured as a bonded body of the lower plate 210 and the upper plate 220 is manufactured by brazing-bonding the lower plate 210 and the upper plate 220 with the brazing filler layer 323.

Figure 5:
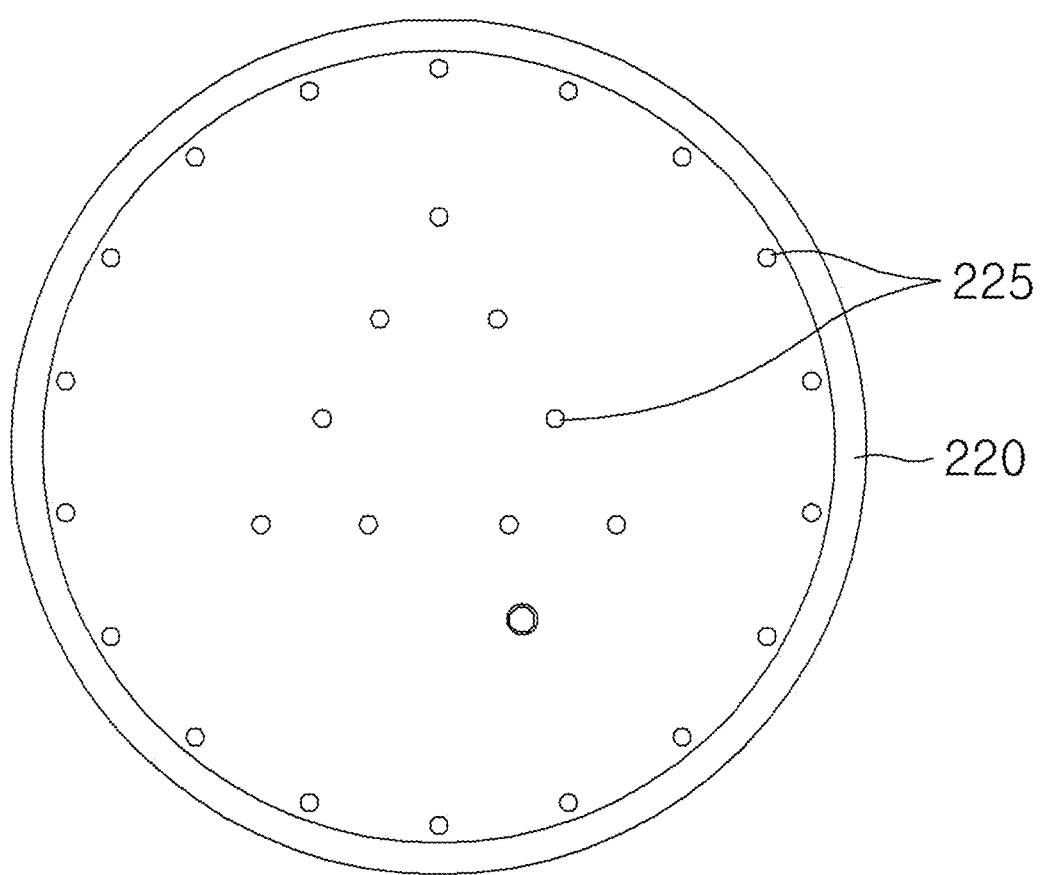
FIG. 5 is a view illustrating an example of a photograph captured from above an actually manufactured upper plate for the base body of the ceramic susceptor according to an embodiment of the present disclosure.

For the brazing-bonding, the conductive filler of the brazing filler layer 323 is capable of bonding the lower plate 210 and the upper plate 220 to each other by bringing the lower plate 210 and the upper plate 220 into close contact with each other, then heating the lower plate 210 and the upper plate 220 to a high temperature, and then cooling the lower plate 210 and the upper plate 220. For example, Au—Ni metal filler, Al-based metal filler, or the like may be used as the conductive filler of the brazing filler layer 323. One side of the upper plate 220 is bonded to the lower plate 210, and as illustrated in FIG. 5, holes 225 corresponding to holes in the insulating plate (1200 in FIG. 3) are provided in other side of the upper plate 220 to be connected to a channel for providing cooling gas or the like, and may be configured to provide cooling gas over the insulating plate (1200 in FIG. 3) as needed.

The above-described lower plate 210 and upper plate 220 are made of metal ceramic composite material, that is, an MMC of Al-ceramic composite powder, in order to prevent deformation from occurring, especially against low temperature deformation due to changes in the extreme process environment. For example, the lower plate 210 and the upper plate 220 may be made of a powder of, for example, a composite of Al with SiC, Si, boron (B), alumina ($Al_2O_3$), graphite, and the like.

In addition, the first active metal layer 321 of the upper plate 220 and the second active metal layer 311 of the lower plate 210 may contain one of Ti, Zr, Nb, Hf, and Ta, or an alloy thereof, and may have a thickness of 1 to 5 μm.

In addition, the first aluminum layer 322 of the upper plate 220 and the second aluminum layer 312 of the lower plate 210 may have a thickness of 5 to 10 μm.

The first active metal layer 321 of the upper plate 220 and the second active metal layer 311 of the lower plate 210 are capable of improving bondability by being melted together with the conductive filler, the first aluminum layer 322, and the second aluminum layer 312 during the brazing-bonding. At interfaces with different physical and chemical properties, an oxidation-reduction reaction is capable of occurring to improve the bondability of both sides to form an interfacial product (see "*Bonding of Ceramic and Metal Using Active Metal Brazing*", *Journal of the Microelectronics & Packaging Society*, Vol. 18, No. 3, p. 1-7).

When the base body 1100 is obtained through the method of manufacturing the ceramic susceptor 1000 according to an embodiment of the present disclosure as described above, the ceramic susceptor 1000 according to an embodiment of the present disclosure may be manufactured by bonding the base body with the insulating plate 1200.

FIG. 3 is a view to be referred to explain a structure of bonding the insulating plate 1200 to the base body 1100 of the ceramic susceptor 1000 according to an embodiment of the present disclosure.

Referring to FIG. 3, the ceramic susceptor 1000 according to an embodiment of the present disclosure includes the base body 1100 including the lower plate 210 and the upper plate 220, and the insulating plate 1200 bonded thereon.

Conductors (or electrodes) 1210 and 1220 are disposed/buried in the above-described insulating plate 1200. As described above, the ceramic susceptor 1000 is a semiconductor device for processing substrates to be processed for various purposes such as a semiconductor wafer, a glass substrate, and a flexible substrate, in which the conductors (or electrodes) 1210 and 1220 may be electrostatic chuck electrodes to be used as an electrostatic chuck for supporting a substrate to be processed, heating wires (or heating elements) for heating the substrate to be processed to a predetermined temperature, RF electrodes used for processing the substrate to be processed through plasma enhanced chemical vapor deposition, or the like.

The base body 1100 includes a cooling channel 215 formed by the groove 211 through brazing-bonding of the lower plate 210 and the upper plate 220 with the brazing filler layer 323. The cooling channel 215 is a channel for the circulation of coolant, such as cooling water or cooling oil, and the coolant may be circulated through the cooling channel 215 in order to maintain the temperature of the ceramic susceptor 1000 at a predetermined level during the semiconductor process.

Meanwhile, bonding portions 230 and 240 of the upper and lower plates 210 and 220 are formed around the bonding channel 215, that is, between two bonding channels 215, and the bonding portions 230 and 240 between the lower and upper plates 210 and 220 may include an upper bonding portion 240 including a first active metal layer 321, a first aluminum layer 322, and a brazing filler layer 323 sequentially laminated on the upper plate 220, and a lower plate bonding portion 230 including a second active metal layer 311 and a second aluminum layer 312 sequentially laminated on the lower plate 210. The lower plate 210 and the upper plate 220 are brazing-bonded with the brazing filler layer 323.

EXAMPLES

Table 1 below shows results obtained regarding leakage of He gas and cooling water for manufactured base bodies 1100 depending on whether or not active metal layers 321 and 323 and aluminum (Al) layers 312 and 322 were applied (applied: O, not applied: X) as surface treatment conditions of the bonding portions 230 and 240 when the MMC lower and upper plates 210 and 220 were used and an Al series metal filler was applied to the brazing filler layers 323.

TABLE 1

| | Common condition | | Surface treatment condition | | Examination results (He gas leakage standard: 1.0E−04 (mbar * l/s) or more) | | |
|---|---|---|---|---|---|---|---|
| Type | Material | Filler | Active metal layer | Al layer | He gas leakage (mbar * l/s) | Colling water results | Bonding |
| 1 | MMC | Al series | X | X | 1.0E−03 | O | Poor |
| 2 | MMC | Al series | O | X | 1.0E−04 | O | Poor |
| 3 | MMC | Al series | O | O | 2.0E−08 | x | Good |

As shown in Table 1 above, in the case where the active metal layers 311 and 321 and aluminum (Al) layers 312 and 322 were not applied, and the case where the active metal layers 311 and 321 were applied but the aluminum (Al) layers 312 and 322 were not applied, the defect in which coolant leaked and the defect in which He gas leakage occurred from the bonding portions at a level equal to or higher than the He gas leakage standard of 1.0E−04 (mbar*l/s) were confirmed. However, as in the present disclosure, when the MMC lower and upper plates 210 and 220 were used, and as the surface treatment conditions for the bonding portions 230 and 240, the active metal layers 311 and 321 and aluminum (Al) layers 312 and 322 were all applied and brazing-bonded, it was confirmed that the bonding portions 230 and 240 were excellently bonded to each other, so there was no leakage of cooling water, and an improvement was obtained in which the gas leakage was reduced to a negligible level below the He gas leakage standard of 1.0E−04 (mbar*l/s).

Table 2 below shows comparison results of defect rates of manufactured base bodies 1100 depending on whether or not active metal layers 321 and 323 and aluminum (Al) layers 312 and 322 were applied (applied: O, not applied: X) as surface treatment conditions of the bonding portions 230 and 240 when the MMC lower and upper plates 210 and 220 were used and an Al series metal filler was applied to the brazing filler layers 323.

TABLE 2

| | Surface treatment condition | | Product manufacturing results | | | | |
|---|---|---|---|---|---|---|---|
| Type | Active metal layer | Al layer | Qty | Good | Poor | Defect rate (%) | Average defect rate (%) |
| 1 | X | X | 6 | 2 | 4 | 67 | 77 |
| 2 | O | X | 7 | 1 | 6 | 88 | |
| 3 | O | O | 6 | 6 | 0 | 0 | 0 |

As shown in Table 2 above, in the case where the active metal layers 311 and 321 and aluminum (Al) layers 312 and 322 were not applied, and the case where the active metal layers 311 and 321 were applied but the aluminum (Al) layers 312 and 322 were not applied, the defect rate for the defect in which coolant leaked and the defect in which He gas leakage occurred from the bonding portions at a level equal to or higher than the He gas leakage standard of 1.0E−04 (mbar*l/s) was 77% on average.

However, as in the present disclosure, when the MMC lower and upper plates 210 and 220 were used, and as the surface treatment conditions for the bonding portions 230 and 240, the active metal layers 311 and 321 and the aluminum Al layers 312 and 322 were all applied and brazing-bonded, the bonding portions 230 and 240 were excellently bonded to each other, so the defect rate was zero.

As described above, in the ceramic susceptor according to the present disclosure and its manufacturing method, by applying multi-layer (active metal layer and aluminum layer) surface treatment between each of the upper and lower plates 220 and 210 of the base body and the brazing filler, the bonding strength between the upper plate 220 and the lower plate 210 of the MMC base body 1100 can be improved. As a result, it is possible to reduce the leak rate of He gas or the like during a process within semiconductor equipment so that the degree of vacuum can be increased, and to reduce leaking of coolant in a cooling channel, thereby contributing to improving yield by maintaining a stable process. In the example, it was confirmed that the He gas leak rate was lowered from the previous 1.0E−03 (mbar*l/s) to the level of 2.0.E−08 (mbar*l/s) after improvement.

In the foregoing, the present disclosure has been described based on specific details, such as specific components, limited embodiments, and drawings, but these are only provided to help a more general understanding of the present disclosure, and the present disclosure is not limited to the above-described embodiments. A person ordinarily skilled in the art to which the present disclosure pertains may make various modifications and changes without departing from the essential characteristics of the present disclosure. Therefore, the spirit of the present disclosure should not be limited to the described embodiments, and not only the appended claims, but also all technical ideas that are equivalent to or equivalently modified to the claims should be interpreted as being included in the scope of the present disclosure.

What is claimed is:

1. A method of manufacturing a base body of a ceramic susceptor, which includes a lower plate and an upper plate which are each made of a metal-ceramic composite and bonded to each other, the method comprising:
    sequentially laminating a first active metal layer, a first aluminum layer, and a brazing filler layer on a bonding surface of the upper plate;
    sequentially laminating a second active metal layer and a second aluminum layer on a bonding surface of the lower plate; and
    brazing-bonding the lower plate and the upper plate such that the first aluminum layer and the second aluminum layer are bonded to each other via the brazing filler layer.

2. The method of claim 1, wherein the lower plate includes a groove between bonding surfaces of the lower plate.

3. The method of claim 1, wherein the first active metal layer and the second active metal layer comprise one or more of Ti, Zr, Nb, Hf, and Ta.

4. The method of claim 1, wherein the first active metal layer and the second active metal layer have a thickness of 1 to 5 μm.

5. The method of claim 1, wherein the first aluminum layer and the second aluminum layer have a thickness of 5 to 10 μm.

6. A ceramic susceptor comprising a base body and an insulating plate,
wherein the base body comprises a lower plate and an upper plate which are each made of a metal ceramic composite, and a bonding portion there between,
wherein the bonding portion comprises:
a first active metal layer, a first aluminum layer, and a brazing filler layer sequentially laminated on the upper plate; and
a second active metal layer and a second aluminum layer sequentially laminated on the lower plate, and
wherein the lower plate and the upper plate are brazing-bonded with the brazing filler layer.

7. The ceramic susceptor of claim 6, wherein the bonding portion is formed between cooling channels of the base body.

8. The ceramic susceptor of claim 6, wherein the first active metal layer and the second active metal layer comprise one or more of Ti, Zr, Nb, Hf, and Ta.

9. The ceramic susceptor of claim 6, wherein the first active metal layer and the second active metal layer have a thickness of 1 to 5 μm.

10. The ceramic susceptor of claim 6, wherein the first aluminum layer and the second aluminum layer have a thickness of 5 to 10 μm.

* * * * *